United States Patent
Wu et al.

(10) Patent No.: US 6,273,962 B1
(45) Date of Patent: Aug. 14, 2001

(54) METHOD TO REDUCE THE PARTICLES IN LOAD-LOCK CHAMBER

(75) Inventors: Kuang-Yung Wu, Taoyuan; Jia-Rurng Hwu, Tainan Hsien; Tien-Min Yuan, Taipei; Shih-Chi Lai, Hsinchu Hsien, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/286,287

(22) Filed: Apr. 6, 1999

(51) Int. Cl.$^7$ ..................................................... H01L 21/00
(52) U.S. Cl. ......................... 134/30; 134/22.12; 134/34; 422/7; 422/9; 422/10; 438/905
(58) Field of Search ................. 438/905; 422/7, 422/9, 10; 134/30, 22.12

(56) References Cited

U.S. PATENT DOCUMENTS 5,378,283 * 1/1995 Ushikawa ............................ 118/719
6,110,232 * 8/2000 Chen et al. ........................... 29/25.01

\* cited by examiner

*Primary Examiner*—Randy Gulakowski
*Assistant Examiner*—Shamim Ahmed
(74) *Attorney, Agent, or Firm*—Nath & Associates PLLC; Harold L. Novick

(57) ABSTRACT

A method for preventing corrosion and particulate in a load-lock chamber is disclosed. The load-lock chamber is adjourning with an etching chamber and a wafer transferred module, each time a wafer in the cassette is transferred into the etching chamber for etching by a transfer arm. After that, the etched wafer is withdrawn by the same way to the cassette. The load-lock chamber comprising an outlet of $N_2$-purge tube therein for venting the vacuum in the load-lock chamber to the surrounding. The method comprising at least a step of coupling heating means to the $N_2$-purge tube, or heating $N_2$ gases before injecting into the $N_2$-purge tube so that the temperature of the $N_2$-purge tube will at least not lower than the temperature of an environment within the load-lock chamber.

10 Claims, 3 Drawing Sheets

METHOD TO REDUCE THE PARTICLES IN LOAD-LOCK CHAMBER

FIELD OF THE INVENTION

The present invention relations to a process chamber environment improvement, and more-particularly to a method to reduce the corrosive particle and/or corrosion in the load-lock chamber.

BACKGROUND OF THE INVENTION

Semiconductor devices are built from a number of different layers deposited sequentially. Hence the lithography techniques and etching process are two vital processes cooperate with deposition used to fabricate the desired pattern and so does a primitive or further device structure.

After the device wafers are processed with a photoresist layer and lithographed to obtain a desired photoresist pattern, the wafers are readied for etching. In an embodiment, the etching process is conducted in a Lam-Alliance series TCP 9400 process system, as shown in the FIG. 1. It includes two load-lock chambers 10, an orientation chamber 18, a transfer module chamber 15 and a number of etching chambers 20. The detailed arrangement of the load-lock chamber 10 is shown in the FIG. 2. In FIG. 2 the wafers had been loaded into a cassette 25 from a process chamber (not shown) before the cassette 25 was transfer to a load-lock chamber 10. The load-lock chamber 10 includes a vacuum pump (not shown) to suck a level of vacuum coming down to about 90 mm torr before the wafers are proceeded to etch. While the vacuum level is about balance to that of the transferred module 15, then a gate 35 of the load-lock chamber 10 is opened. After that, a wafer transfer arm 30 of the transfer module chamber 15 removes a single semiconductor wafer which is within a cassette 25 to an etching chamber 20 for processing i.e. removes the unmasked portions of the wafer via a orientation process in the orientation chamber 18. Generally, the etching techniques consist of dry and wet etching methods. The Lam-Alliance series process system includes several dry etch chambers 20. For performing a dry etching, the environment of the etching chamber 20 is set to maintain to an apt low pressure in accordance with the process requirement. Before the wafer is transferred into the etching chamber 20, the $N_2$ purge to a vacuum level, which is the same vacuum as the transferred module 15. After the etching process is achieved, the purge process to the same vacuum as the transferred module 15, and then the transfer arm 30 withdraws the etched wafer to the original cassette 25 in the load-lock chamber 10. A second wafer follows sequentially to proceed the etching process. The cassette 25 will not transferred from the load-lock chamber 10 to another process chamber till all wafers are etched away. In an embodiment, each batch of wafers is about twenty-five pieces of wafers.

After etching process is achieved, the gate 35 is closed and $N_2$ gas is flowed via an $N_2$-purge tube 40 into the load-lock chamber 10 to vent the vacuum to the surrounding atmosphere. An another gate 38 of the load-lock chamber 10 is then opened and another transferred arm (not shown) withdraws the cassette 25 to proceed further processes. It is found that some of the corrosive particulate disperse onto the space and walls of the load-lock chamber, and cause the corrosion to occur before a regular cleaning the load-lock chamber 10 commences. The interval between regular cleaning is about processing two thousands piece of wafers, generally. For solving above corrosion and particulate/contamination issue, a conventional approach is by shortening the duty cycle. However, it will pull down the throughput. The invention provides an efficient method to solve above issues.

SUMMARY OF THE INVENTION

A method for preventing corrosion and particulate in a load-lock chamber is disclosed. The load-lock chamber is adjourning at least one etching chamber and a wafer transferred module, each time the wafer transferred module transfer a wafer in a cassette, which is in the load-lock chamber into the etching chamber to etch. After that, the etched wafer is withdrawn to the cassette. The load-lock chamber comprises a $N_2$-purge tube with a outlet setting in the load-lock chamber for venting the pressure in the load-lock chamber to its surrounding atmosphere. The method comprises at least either step of coupling heating means to the $N_2$-purge tube or heating $N_2$ gases before injecting into the $N_2$-purge tube so that the temperature of the $N_2$-purge tube is at least not lower than the temperature of the environment in the load-lock chamber. The higher temperature of $N_2$-purge would efficiently prevent any residue etching gases carried by the etching chamber trapped thereon.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

For solving the forgoing issues such as corrosion and/or particulate contamination in the load-lock chamber 10, it has to investigate what kind of particulate is and find where it comes from.

The present invention proposes an improving method.

Figure 1:
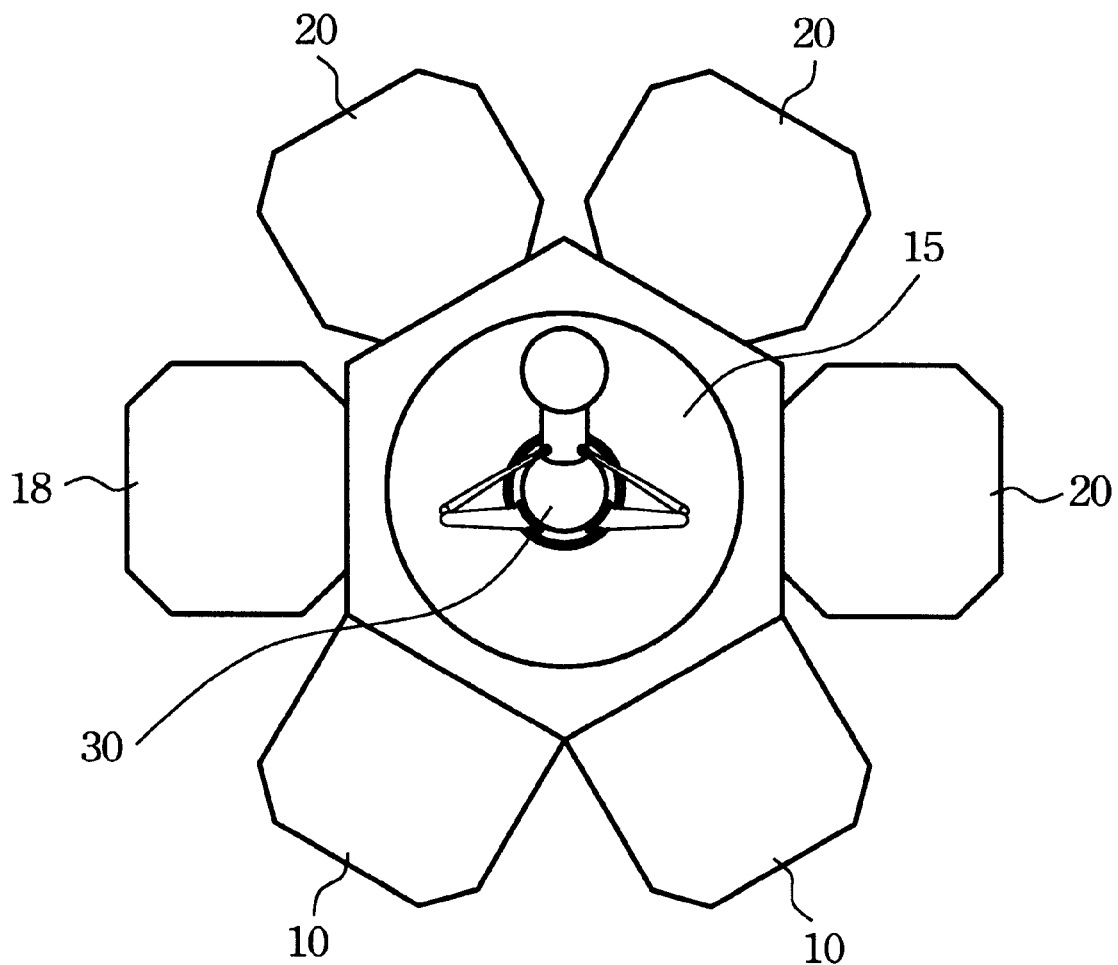
FIG. 1 is a synoptic layout of a Lam-Alliance process system that including load-lock chambers, wafer transferred module, and a plurality of etching chambers.
Figure 2:
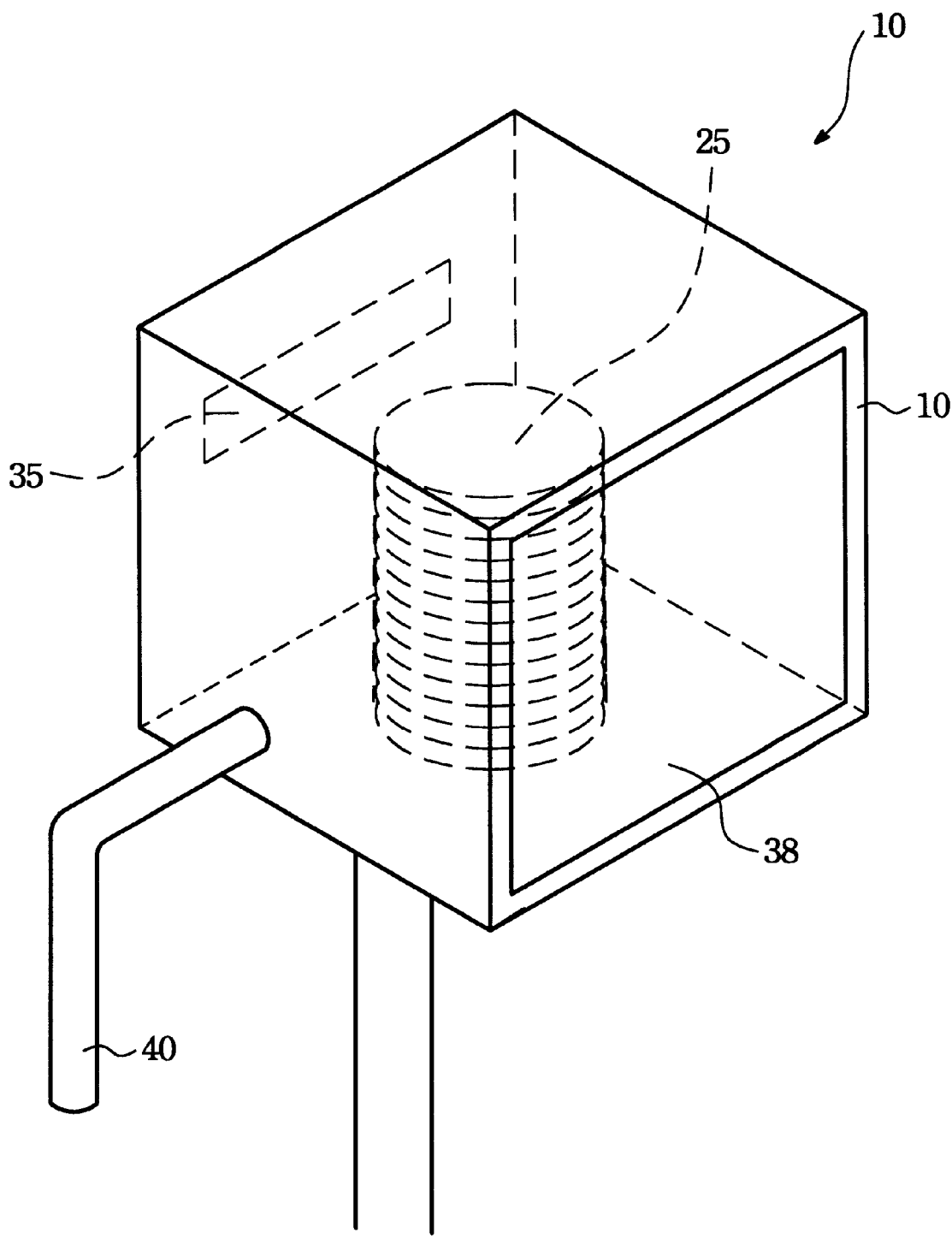
FIG. 2 is a front view of a load-lock chamber, which has a $N_2$-purge tube in accordance with the prior art.

As is aforementioned in the background of the invention, while the wafers loaded into a cassette 25 (please still referring to FIGS. 1–2) from the process chamber (not shown) to a load-lock chamber 10, a vacuum pump is conducted to pump a vacuum level, which come down to about 90 mm-torr. This level is about the same vacuum as the wafer transfer module chamber for a balance. Then a wafer-transferred arm 30 removes a single wafer to an etching chamber 20 for processing after an orientation is performed in the orientation chamber 18. For performing a dry etching, the environment of the etching chamber 20 has a temperature of about 60–70° C. and at a lower pressure level than the transfer module chamber 15. As forgoing depicted in the background of the invention, after the etching process is achieved, and for proceeding further process, $N_2$ gas flows via an $N_2$-purge tube 40 into the load-lock chamber 10 to vent the vacuum up to the surrounding atmosphere. The other gate 38 of the load-lock chamber 10 is opened to withdraw the cassette thereto. It is noted that while the wafers are transferred into the load-lock chamber 10, the residue of the photoresist and the etched by-product, polymers, remains on the wafers contain a bit of etching gases being carried at the meantime. Most of them may be removed by the vacuum pump. However, it is also found that the $N_2$-purge tube 40, which has an outlet setting in the load-lock chamber, is usually with a lower temperature than the environment of the load-lock chamber 10. Thus most of the gases including polymers and residues will be trapped and accumulated at the surround of the $N_2$-purge tube 40, both its inside-wall and outside-wall. Thus the portion of residue gases is difficult to rid. The gases will cause the corrosion and particulate issues. The corrosive particulate will then be dispersed onto the wall of the load-lock chamber and cause the corrosion to occur before a regular cleaning the load-lock chamber comment.

The situation is even more deteriorated because the $N_2$ gas via an outlet of the $N_2$-purge tube 40, fluctuate the residue polymer while venting. As a result, the etching gases, such as $HBr$, $Cl_2$ gases, filled the environment before such gases are sucked out by the vacuum pump when the transfer arm 30 withdraws the cassette 25.

Figure 3:
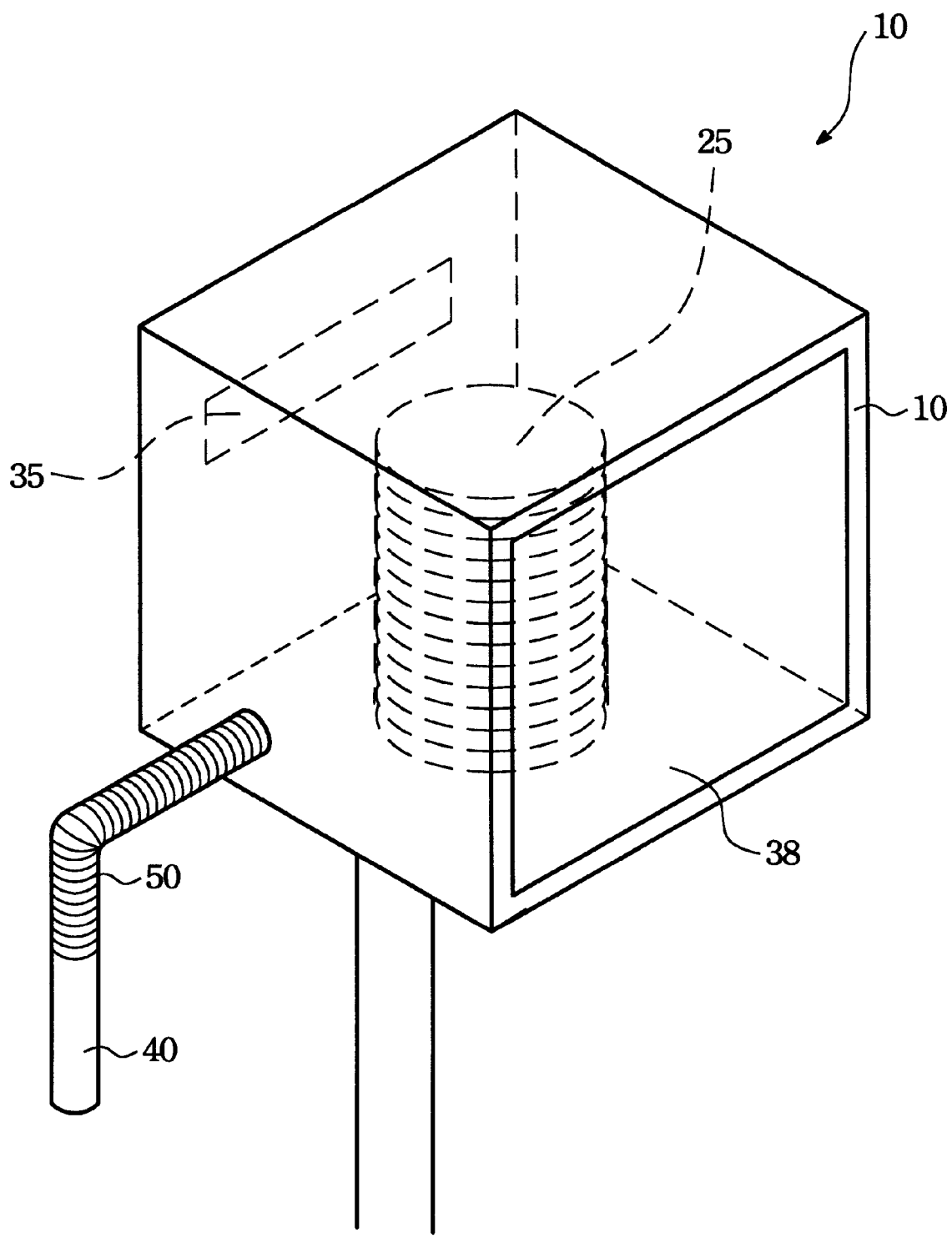
FIG. 3 is a front view of a load-lock chamber, which has a $N_2$-purge tube with a heating coil in accordance with the present invention.

Consequently, to solve above problems, it should prevent the polymers accumulate at the $N_2$-purge tube 40. In a prefer embodiment, the temperature of the $N_2$-purge tube 40 is heated so that it at least has a temperature same as the environment of the load-lock chamber. Preferably, for a load-lock chamber with room temperature, the temperature of the $N_2$ tube is about 22–40° C. Heating apparatus such as a heating-coil 50 warps the $N_2$-purge tube 40, as is shown in FIG.3. Alternatively, the preheating the $N_2$ gases before it flows into the $N_2$-purge tube 40.

The benefits of this invention are:

(1) the particulate contamination the wafers and/or corrosion the load-lock chamber are resolve;

(2) the approaching method is easily to achieved since the basic concept is to increase the temperature of the $N_2$-purge tube so that the temperature of it keeps the same as the environment of the load-lock chamber.

A simple heating apparatus, such heating coil or a preheating $N_2$ gas, is sufficient. Hence the invention is also low cost.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method for preventing corrosion and particulate in a load-lock chamber, said load-lock chamber comprising an outlet of a $N_2$-purge tube setting in said load-lock chamber, and said load-lock chamber enclosing an environment having a first temperature, said method comprising:

coupling heating means to said $N_2$-purge tube; and heating $N_2$ gases before injecting the $N_2$ gases into said $N_2$-purge tube so that said $N_2$-purge tube has a second temperature being at least not lower than said first temperature of said environment in said load-lock chamber.

2. The method of claim 1, wherein said heating means comprise a heating coil.

3. The method of claim 1, wherein said $N_2$-purge tube is used for releasing said load-lock chamber vacuum up to an atmosphere as its surrounding by $N_2$ gas dispersing via said outlet of said $N_2$-purge tube.

4. The method of claim 1, wherein said $N_2$-purge tube is kept to a temperature of about 22–40° C.

5. A method for preventing corrosion and particulate in a load-lock chamber, from which a wafer in a cassette is transferred by a transferred module thereto an etching chamber, and then withdrawing said wafer to said cassette, said load-lock chamber comprising an outlet of a $N_2$-purge tube therein, wherein said load-lock chamber encloses an environment having a first temperature, said method comprising:

coupling heating means to said $N_2$-purge tube; and heating $N_2$ gases before injecting the $N_2$ qases into said $N_2$-purge tube so that said $N_2$-purge tube has a second temperature being at least not lower than said first temperature of said environment in said load-lock chamber.

6. The method of claim 5, wherein said $N_2$-purge tube is kept to about 22–40° C.

7. The method of claim 5, wherein said $N_2$-purge tube is used for releasing said load-lock chamber vacuum up to an atmosphere as its surrounding by $N_2$ gas dispersing via said outlet of said $N_2$-purge tube.

8. An apparatus for preventing corrosion and particulate in a load-lock chamber, wherein said load-lock chamber encloses an environment having a first temperature comprising:

a $N_2$-purge tube, set in said load-lock chamber, having an outlet; and heating means, coupling said $N_2$-purge tube, for heating said $N_2$-purge tube to a second temperature being at least not lower than said first temperature of said environment within said load-lock chamber.

9. The apparatus of claim 8, wherein said $N_2$-purge tube is about 22–40° C.

10. The apparatus of claim 8, wherein said $N_2$-purge tube is used for releasing said load-lock chamber vacuum up to an atmosphere as its surrounding by $N_2$ gas dispersing via said outlet of said $N_2$-purge tube.

* * * * *